United States Patent [19]
Suzuki

[11] Patent Number: 6,049,038
[45] Date of Patent: Apr. 11, 2000

[54] FLIP-CHIP RESIN SEALING STRUCTURE AND RESIN SEALING METHOD

[75] Inventor: Motoji Suzuki, Tokyo, Japan

[73] Assignee: NEC Corporation, Tokyo, Japan

[21] Appl. No.: 09/124,910

[22] Filed: Jul. 30, 1998

[30] Foreign Application Priority Data

Aug. 1, 1997 [JP] Japan ..................................... 9-207558

[51] Int. Cl.⁷ .................................................. H01L 23/28
[52] U.S. Cl. ........................ 174/52.2; 361/714; 361/704; 361/713; 361/718; 361/719; 361/679; 257/783; 257/777; 438/108; 438/127
[58] Field of Search ........................... 174/52.2; 361/713, 361/704, 714, 718, 719, 679; 257/777, 783; 438/108, 127

[56] References Cited

U.S. PATENT DOCUMENTS 5,450,283  9/1995  Lin et al. ................................. 361/704

FOREIGN PATENT DOCUMENTS 3-241860  10/1991  Japan .
3-241861  10/1991  Japan .
7-45754   2/1995   Japan .

*Primary Examiner*—William A. Cuchlinski, Jr.
*Assistant Examiner*—Ronnie Mancho
*Attorney, Agent, or Firm*—Whitham, Curtis & Whitham

[57] ABSTRACT

A sealing resin mixed with filler is used to seal a space between a flip-chip mounted semiconductor device and a printed circuit board. An integrated circuit chip joined to the printed circuit board by metal bumps, has the sealing resin interposed in the space between the chip and the board. The density of the filler in the sealing resin varies such that there is a relatively greater amount of filler at or near the integrated circuit chip. This allows the coefficient of thermal expansion of the resin layer adjacent the chip to better match the coefficient of thermal expansion of the silicon which makes up the chip.

9 Claims, 3 Drawing Sheets

7: RESIN CURING FIXTURE
8: CURING OVEN

FLIP-CHIP RESIN SEALING STRUCTURE AND RESIN SEALING METHOD

BACKGROUND OF THE INVENTION

1. Field of the Invention

The present invention relates to a resin sealing structure for flip-chip mounting an IC chip face-down onto a printed circuit board and also to a sealing resin and a method of injecting resin that are used in flip-chip mounting.

2. Description of Related Art

In the past, the method of flip-chip mounting an IC chip to a printed circuit board in a face-down manner is well known. An example of a structure for mounting a semiconductor device by flip-chip mounting is shown in FIG. 4.

Specifically, in the flip-chip mounting used in the past, metal bumps 6 which are formed on aluminum pad electrodes of an IC chip 2 are generally joined to mounting pads on a printed circuit board 1 via a joining material.

Then, to alleviate the stress placed on the joining part which occurs because of the difference in coefficient of thermal expansion between the printed circuit board 1 and the IC chip 2, a sealing resin 3 is injected into a space formed between the printed circuit board surface and a surface of the IC chip 2, after which appropriate thermal treating is done to harden the resin 3 thereby achieving sealing.

The sealing resin 3 suppresses the intrusion of water content or impurity ions from the printed circuit board 1 or the outside, into the IC chip circuit surface and into the aluminum pads, thereby serving to improve reliability in the presence of moisture.

In the prior art, because the coefficient of thermal expansion of the above-noted sealing resin 3 and that of the IC chip 2 were generally different, and because thermal stress would be applied to the semiconductor device, the difference in coefficient of thermal expansion between the sealing resin 3 and the IC chip 2, would cause deformation of a different type. This causes a concentration of stress on the joining part, which often results in peeling at the joining part therebetween or the occurrence of cracks in the resin part, these representing product defects.

For the above-noted reason, in the past, a filler component having an appropriate size was generally added to the sealing resin that serves as a base, the amount of filler component or particle size thereof being adjusted so as to achieve the same or approximately same coefficient of thermal expansion in the sealing resin 3 and IC chip 2.

In the Japanese Unexamined Patent Publication (KOKAI) No. 7-45754, as shown in FIG. 5, discloses of the use of a filler within the sealing resin, this filler having distribution of two types of particle diameters, one larger than the spacing between the printed circuit board 12 and the IC chip 19 and one smaller than this spacing, a resin layer that includes only a filler having a particle diameter that is smaller than the spacing between the printed circuit board and the IC chip being formed in the space between the printed circuit board and the IC chip, so that even when thermal shrinkage of the resin layer because of the heat generated when the IC operates, the distance between the printed circuit board and the IC chip does not become smaller than the included filler particles, thereby preventing damage, for example, to the electrode pattern formed on the surface of the IC chip.

In the prior art, however, in order to solve the problems in a configuration in which entire IC chip 19 is covered with a sealing resin, all that is indicated is a technology for mixing the filler components throughout the entire resin, and this does not disclose, for example, technology related to the solution of the specific problem that exists between the IC chip 2 and the sealing resin 3 in the flip-chip mounting method.

As described above, the sealing resin used in flip-chip mounting, in addition to the purpose of alleviating the stress placed upon the joining part, also has the object of increasing the reliability in the presence of moisture, and a particularly strong, intimate contact is required between the sealing resin and the printed circuit board in order to suppress the absorption of moisture from the boundary between the sealing resin and the printed circuit board.

In order to improve the intimate contact strength between the sealing resin and the printed circuit board, it is generally effective to reduce the amount of filler added to the resin.

This, however, increases the coefficient of thermal expansion of the overall resin, thereby increasing the difference with respect to the coefficient of thermal expansion of the IC chip, the result being that, with respect to thermal stress that occurs because of expansion and contraction, there is a concentration of stress at the joint between the aluminum pad electrodes of the IC chip and the metal bumps, which is a particularly weak joint, this causing cracks and the like in the joint, thereby lowering the reliability with respect to thermal stress, this being at odds with the goal of achieving an improvement in reliability in the presence of moisture.

Additionally, increasing the amount of filler which must be added to make the coefficient of thermal expansion of the sealing resin approach that of the IC chip results in an increase in the viscosity of the sealing resin. The increased viscosity results in the problem of hindering the ease of injection of the sealing resin.

Thus, simply increasing the amount of filler added to the sealing resin results in an increase the viscosity of the resin, this leading to the problem of more difficult injection thereof.

The above-noted problems are encompassed also in the same manner in the Japanese Unexamined Patent Publication (KOKAI) No. 7-45754, under conditions of thermal stress by expansion and contraction.

An object of the present invention is to provide a sealing resin structure, and a sealing resin injection method which, in a flip-chip mounting method for mounting an IC chip in face-down manner to a printed circuit board, solves the problem described above in the prior art.

SUMMARY OF THE INVENTION

To achieve the above-noted object, the present invention as the following basic technical constitution.

Specifically, a first aspect of the present invention is a flip-chip mounted semiconductor device in which an IC chip is mounted in a face-down manner onto a printed circuit board, and in the space formed between the IC chip circuit surface and printed circuit board with metal bumps interposed therebetween, a sealing resin into which is mixed a filler, being injected and the mixture density of the filler that is mixed into the sealing resin being such that it differs with respect to the spacing direction between the IC chip and the printed circuit board.

A second aspect of the present invention is a resin injection method for a flip-chip mounted semiconductor device, whereby when an IC chip is mounted in a face-down manner onto a printed circuit board and a sealing resin having mixed into it a filler is inserted in the space formed between the IC chip circuit surface and printed circuit board surface with metal bumps interposed therebetween, the mixture density of the filler that is mixed into the sealing resin differs in the spacing direction between the IC chip circuit surface and the printed circuit board surface.

Because the flip-chip mounted semiconductor device and resin injection method for flip-chip mounting of a semiconductor device according to the present invention employ the configurations as noted above, an appropriate filler density distribution is imparted to the sealing resin in the direction of the space between the IC chip circuit surface and the printed circuit board surface, this causing a concentration of the filler at or near the boundary between the IC chip circuit surface and the sealing resin, at which there is a large amount of this filler, making it possible with a single resin to achieve a resin layer that has a coefficient of thermal expansion that is closer to the main component silicon that makes up the IC chip.

By doing this, when performing flip-chip mounting, because the joint between the aluminum pad electrodes of the IC chip and the metal bumps, which is particularly weak, is supported by a resin layer that has a coefficient of thermal expansion that is closer to the main component silicon, it is possible to improve the reliability with respect to thermal stress.

DETAILED DESCRIPTION OF THE PREFERRED EMBODIMENTS

Embodiments of a flip-chip mounted semiconductor device, of the present invention are described below, with reference being made to the relevant accompanying drawings.

Figure 1:
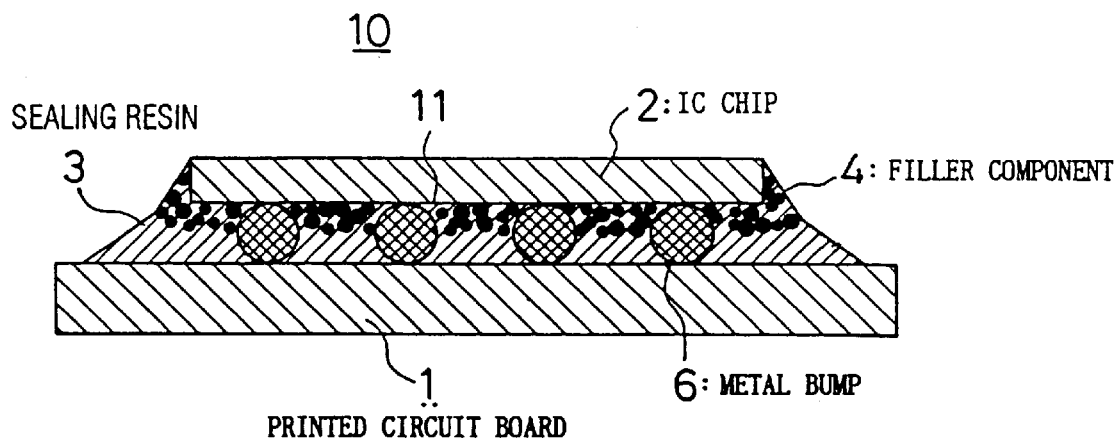
FIG. 1 is across-sectional view of the configuration of an example of flip-chip mounted semiconductor device according to the present invention.

Specifically, FIG. 1 is a cross-sectional view which shows the configuration of an example of a flip-chip mounted semiconductor device according to the present invention.

This drawing shows a flip-chip mounted semiconductor device 10, in which an IC chip 2 is mounted with a face-down manner to a printed circuit board 1. A sealing resin 3, into which is mixed a filler 4, is injected into the space formed between the IC chip circuit surface 11 and the printed circuit board 1 by metal bumps 6 and disposed therebetween. The mixture density of the filler 4 that is mixed into the sealing resin 3 varies in the direction of the space between the IC chip circuit surface 11 and the printed circuit board 1.

That is, in the present invention, the mixture density of the filler 4 with respect to the sealing resin 3 exhibits a prescribed distribution in the direction across the spacing between the IC chip 11 and the printed circuit board 1.

In a preferred aspect of the present invention, the mixture density of the filler 4 with respect to the sealing resin 3 has a distribution such that the mixture density at or near the junction surface between the IC chip 1 and the sealing resin 3 is relatively higher than the mixture density in other parts.

The present invention is not restricted with regard to the shape of the do mixture density of the filler component 4 with respect to the sealing resin 3, and it permits mixture density of the filler component 4 with respect to the sealing resin 3 to be a prescribed slope from the surface of the printed circuit board 1 to the IC chip circuit surface 11.

Additionally, as shown in FIG. 1, the filler component 4 is concentrated in its mixture density at or in proximity to the joining surface between the IC chip and the sealing resin 3, and the filler component 4 at or in proximity to the joining surface between the surface of the printed circuit board 1 and the sealing resin 3 can be adjusted to be zero or extremely little.

Additionally, the present invention does not present a particular restriction with regard to the particle diameter of the filler component 4 that is used therein, and it is possible to use a filler component 4 that has an arbitrary particle diameter, to use a filler component 4 that has only a single particle diameter, and also possible to use a filler component 4 that has two or more different particle diameters.

That is, a feature of the present invention is that, in mounting an IC chip 2 to a printed circuit board 1 with a face-down manner by the flip-chip mounting method, the filler component that is included as part of the sealing resin is concentrated in the joining region of the metal bumps 6 that are for the purpose of making connection between the IC chip circuit surface 11 on which an aluminum pad electrodes being formed and the printed circuit board 1.

In this sealing structure, the sealing resin has at least two coefficient of thermal expansions each of which being different from each other in one sealing resin and, for example, the coefficient of thermal expansion at a portion close to the IC chip at which the fillers being concentrated in the region of the IC chip. As a result, the sealing resin has a coefficient of thermal expansion that is closer to the coefficient of thermal expansion of silicon, which is the material of the IC chip.

Additionally in the present invention an appropriate filler component 4 is mixed into the sealing resin 3 which is injected as a flip-chip sealing resin into the space between the IC chip circuit surface 11 and the surface of the printed circuit board 1, the filler component 4 which is included in the sealing resin 3 being caused to have a concentrated distribution in a specific part thereof, so that this part has a coefficient of thermal expansion that is close to that of silicon, which is the material of the IC chip.

Therefore, by causing the filler component 4 in the sealing resin 3 to have a concentrated distribution in a specific layer or part, it is possible to form, in a single resin, a resin layer that has a coefficient of thermal expansion that is close to that of silicon.

By doing this, in flip-chip mounting it is possible to alleviate concentrations of stress caused by a difference in coefficient of thermal expansion between the IC chip 2 and the printed circuit board 1, effectively. While there is no restriction in the present invention with regard to the method of imparting a prescribed mixture density distribution to the filler component 4 within the sealing resin 3, it is desirable that, for example, in flip-chip mounting, the sealing resin 3, which contains filler component 4 therein, is injected between a space formed between the IC chip 2 and the printed circuit board 1, after which the semiconductor device 10 is turned over and held so that the IC chip 2 is at a bottom position, thereby lowering the viscosity of the sealing resin 3, with heating being preferably done so that the filler component sinks thereby causing a concentrated disposition of the filler component 4 at or near the joining surface between the IC chip 2 and the sealing resin, and it is further desirable that appropriate vibration be imparted during the process of causing the filler component to sink.

That is, in the present invention by supporting the junction part formed between the aluminum electrode pads of the IC chip 2 which has low junction strength and a metallic bump, by a sealing resin that has a coefficient of thermal expansion that is close to that of silicon, which being base material, it is possible to improve the reliability with respect to thermal stress.

Additionally, there is an intimate contact made between sealing resin which does not include the filler component and printed circuit board. The contacting surface area being increased compared with the part that has filler component content, thereby increasing the strength of the intimate contact, resulting in a sturdy intimate contact.

By doing this, the intrusion of water content from the printed circuit board or from outside, or of impurity ions into the IC chip circuit surface and aluminum pads is suppressed, thereby enabling an improvement in reliability in the presence of moisture.

That is, a feature of the present invention is that the sealing resin 3 has different coefficient of thermal expansions at with respect to the position in the direction across the spacing formed between the IC chip circuit surface 11 and the printed circuit board 1.

Another feature of the present invention is that the coefficient of thermal expansion in the part at the joining surface between the IC chip circuit surface 11 and the sealing resin 3 is caused to be close to the coefficient of thermal expansion of the material that makes up the IC chip 2.

Additionally, it is desirable in the present invention that the particle diameter in the filler component 4 that is added to the sealing resin 3 is sufficiently smaller than the dimension of the spacing formed between the IC chip circuit surface 11 and the printed circuit board 1.

The configuration of a specific example of a flip-chip mounted semiconductor device 10 according to the present invention is described in detail below.

First, in FIG. 1 IC chip 2 has metal bump 6, which is formed on top of an aluminum pad electrode.

This metal bump 6 is aligned with a mounting pad of the printed circuit board 1, and prescribed heating and pressure are applied so that joining, via a joining material, is achieved, as well as an electrical continuity.

Then, a sealing resin 3 is injected into and cured in the space between the IC chip 2 and the printed circuit board 1, thus achieving resin sealing.

In this embodiment of the present invention, with respect to the silicon which is the material of the IC chip 2 and which has a coefficient of thermal expansion of approximately $3 \times 10^{-6}/°$ C., the sealing resin 3 has an epoxy resin as its base, to which is added 45 to 45% by weight of a silica-based filler component, thereby adjusting its coefficient of thermal expansion to approximately $4 \times 10^{-5}/°$ C.

The particle diameter of the filler component is approximately 2.5 $\mu$m, which is sufficiently smaller than the spacing of approximately 70 $\mu$m between the IC chip 2 circuit surface and the printed circuit board 2.

The sealing resin 3 is completely cured by heating after injection.

Figure 2:
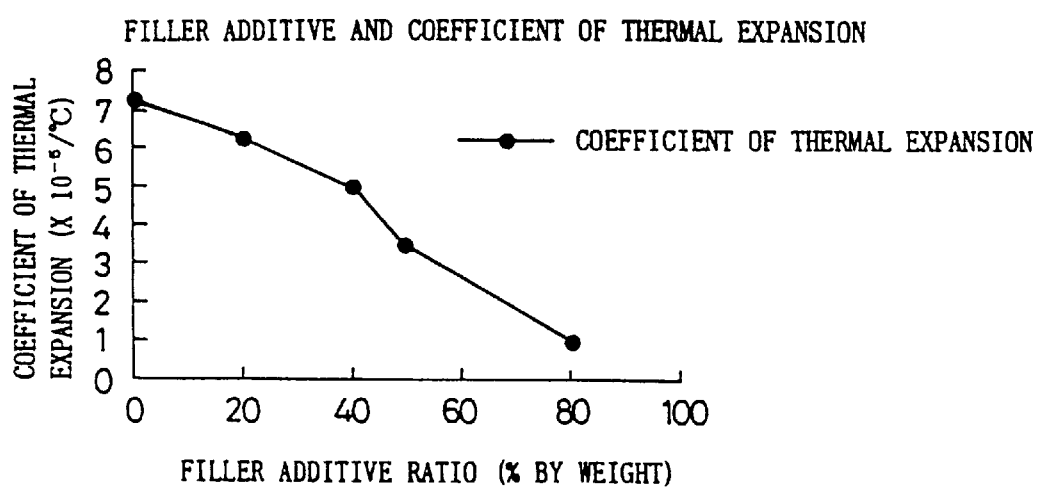
FIG. 2 is a graph which shows the relationship between the coefficient of thermal expansion of the sealing resin used in an embodiment of the present invention and the filler component mixture density.

FIG. 2 is a graph which shows the relationship between the mixture density of the filler component in the sealing resin and the coefficient of thermal expansion in this embodiment.

The sealing resin 3, as shown in FIG. 1, is formed into two resin layers, these having different distributions of the filler component within a single sealing resin.

If the first resin layer in the region close to the IC chip 2, in which there is a concentration of the filler component 4 in a single resin and the volume ratio thereof is 1, the volume ratio between the two resin layers is such that the second resin layer in the region closed to the printed circuit board 1, in which there is almost no filler component 4, is approximately ¾ thereof.

By virtue of the above arrangement, the additive ratio of the filler component 4 in the first resin layer near the IC chip 2, from the volume ratio thereof, is approximately 80% by weight, the coefficient of thermal expansion thereof being, as shown in FIG. 2, approximately $1.0 \times 10^{-5}/°$ C., this being close to the coefficient of thermal expansion $3 \times 10^{-6}/°$ C. of silicon.

Next, a method of injecting and curing resin to achieve this type of sealing resin structure will be described, with reference being made to FIG. 3.

Figure 3:
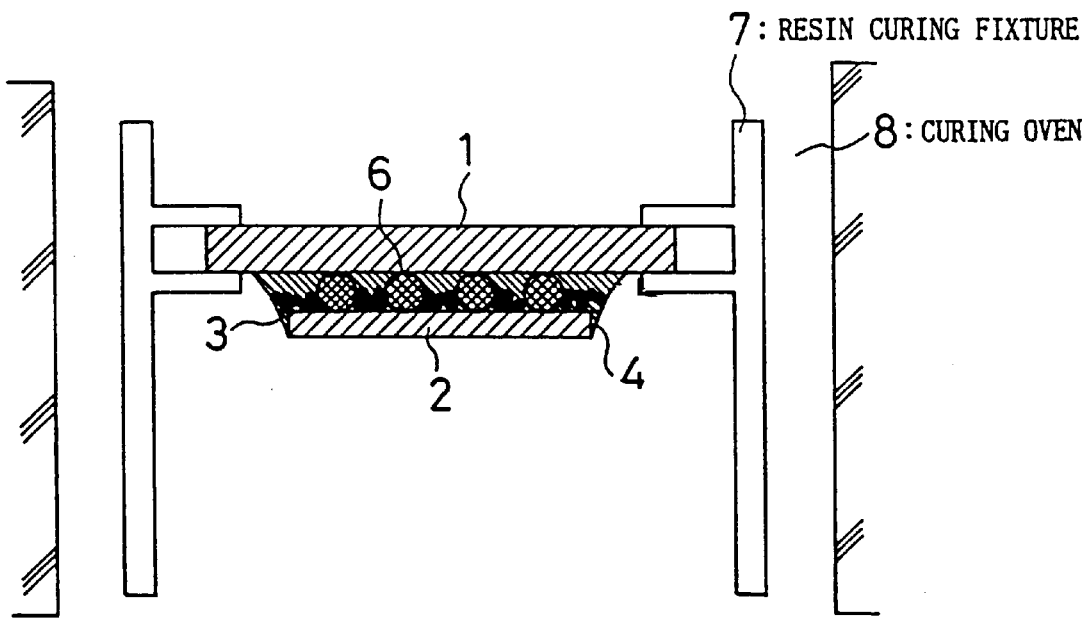
FIG. 3 is a cross-sectional view which shows an example of the sealing curing method with regard to a flip-chip mounted semiconductor device according to the present invention.
Figure 4:
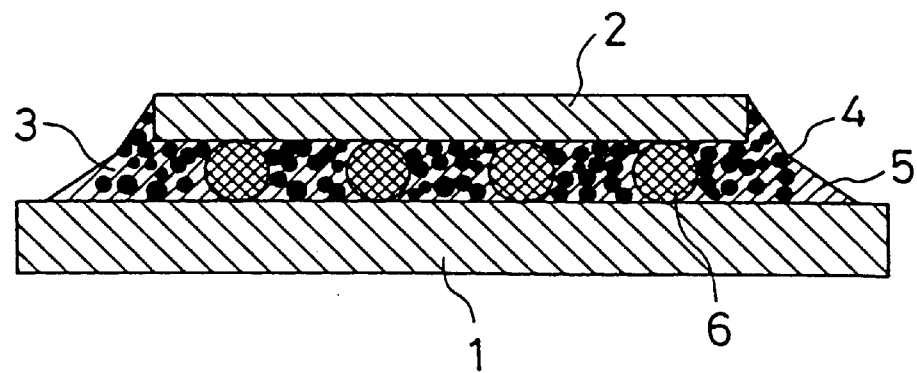
FIG. 4 is a cross-sectional view which shows the flip-chip resin sealing structure of the prior art.
Figure 5:
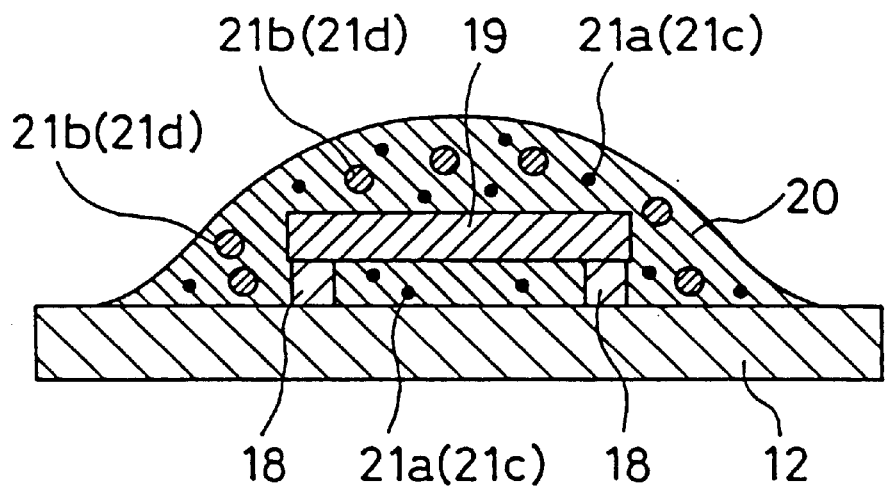
FIG. 5 is a cross-sectional view which shows an IC resin sealing structure of the prior art.

In FIG. 3, a resin curing fixture 7 is disposed inside a resin curing oven 8 so that the printed circuit board 1 into which is injected the sealing resin 3 is held upside down.

The curing oven 8 has a temperature-rise profile that increases the sealing resin 3 up to a prescribed curing temperature that can be arbitrarily controlled by means of a priorly established program.

First, the fluidity of the sealing resin 3 is increased at a temperature that is lower than the curing starting temperature, the sealing resin 3 being held this way for a prescribed amount of time.

By doing this, the filler component 4 sinks by virtue of its own weight, so that it concentrates at the circuit surface of the IC chip 2.

Then, the internal temperature of the curing oven 8 is caused to increase to the curing temperature of the sealing resin 3, this being maintained for a prescribed amount of time, so as to complete the curing, the result being a resin-sealed structure such as shown in FIG. 1.

That is, the present invention provides a resin injection method whereby with respect to the IC chip 2, which is mounted face-down onto the printed circuit board 1, when a sealing resin 3 into which has been mixed a filler component 4 is inserted into the space formed between the IC chip circuit surface 11 and the printed circuit board 1 with the metal bumps 6 interposed therebetween, the sealing is performed so that the mixing density of the filler component 4 that is mixed into the sealing resin 3, differs in the direction across the spacing between the IC chip circuit surface 11 and the printed circuit board 1.

In the above-noted resin sealing method for a flip-chip mounted semiconductor device, it is desirable that a distribution be imparted to the filler component 4 mixing density so that the mixing density near the joining surface between the IC chip circuit surface 11 and the sealing resin 3 is relatively high compared with other parts.

Additionally, it is desirable that the filler component 4 mixing density in the sealing resin be varied so that the coefficient of thermal expansion in the part near the joining surface between the IC chip circuit surface 11 and the sealing resin 3 is close to the coefficient of thermal expansion of the material making up the IC chip.

As described in detail above, according to the present invention, by imparting a concentrated distribution of the filler component 4 in the sealing resin 3 at a prescribed position therein, it is possible in a single resin to form a resin layer that has a coefficient of thermal expansion that is close to that of silicon.

By doing this in flip-chip mounting, the joining part between the aluminum pad electrodes of the IC chip 2 an the metal bumps 6, which has a low joining strength, is held by a resin layer that has a coefficient of thermal expansion that is closer to silicon, which is the main material of the IC chip, the result being an improvement in the reliability of the joint with respect to thermal stress.

Additionally, there is an intimate contact between the resin layer that does not include the filler component 4 and the part of the printed circuit board other than the joining parts, the strength of the intimate contact therebetween being increased with respect to the case in which there is filler component 4 content.

The result of this is that the intrusion of water content from the printed circuit board or from outside, or of impurity ions into the IC chip circuit surface and aluminum pads is suppressed, thereby enabling an improvement in reliability in the presence of moisture.

Additionally, because the distribution of the filler component 4 is forcibly changed after injection of the sealing resin, the coefficient of thermal expansion of the sealing resin 3 approaches the coefficient of thermal expansion of the IC chip 2, thereby eliminating the need to use a resin having a large amount of filler component 4 additive, thereby enabling suppression of an increase in viscosity that occurs when there is a large amount of filler added, while improving the ease of injecting the sealing resin.

What is claimed is:

1. A flip-chip mounted semiconductor device comprising:
   an IC chip mounted in a face-down manner to a printed circuit board;
   a sealing resin into which is mixed a filler, said sealing resin being inserted into a space formed between an IC chip circuit surface and a surface of said printed circuit board;
   a multiplicity of metal bumps interposed between said IC chip circuit surface and said surface of said printed circuit board and extending through said sealing resin;
   wherein a mixing density of said filler that is mixed into said sealing resin varies with respect to a direction across said space formed between said IC chip circuit surface and said surface of said printed circuit board.

2. A flip-chip mounted semiconductor device according to claim 1, wherein said filler mixing density increases relatively closer to said IC chip circuit surface.

3. A flip-chip mounted semiconductor device according to claim 1, wherein said filler mixing density has a distribution such that said mixing density is relatively greater in a part near a joining surface between said IC chip circuit surface and said sealing resin than it is at another part.

4. A flip-chip mounted semiconductor device according to claim 1, wherein said sealing resin has a coefficient of thermal expansion that differs in a direction across said spacing formed between said IC chip circuit surface and said surface of said printed circuit board.

5. A flip-chip mounted semiconductor device according to claim 4, wherein the coefficient of thermal expansion at a part that is near a joining surface formed between said IC chip circuit surface and said sealing resin approaches the coefficient of thermal expansion of a material that makes up said IC chip.

6. A flip-chip mounted semiconductor device according to claim 1, wherein a particle diameter of said filler mixed into said sealing resin is smaller than a dimension of said spacing formed between said IC chip circuit surface and said surface of said printed circuit board.

7. A resin sealing method whereby, with respect to an IC chip, which is mounted face-down onto a printed circuit board, when a sealing resin into which has been mixed a filler is inserted into a space formed between said IC chip circuit surface and a said printed circuit board and said IC chip circuit surface is joined to said printed circuit board by a metal bump, sealing is performed so that a mixing density of said filler that is mixed into said sealing resin differs in the direction across said spacing formed between said IC chip circuit surface and said printed circuit board.

8. A resin sealing method according to claim 7, whereby resin sealing is performed so that said mixing density of said filler has a distribution such that said mixing density at a part that is close to a joining surface between said IC chip circuit surface and said sealing resin is relatively high compared to another part.

9. A resin sealing method according to claim 7, whereby said filler mixing density in said sealing resin is varied so that the coefficient of thermal expansion at a part near a joining surface formed between said IC chip circuit surface and said sealing resin approaches the coefficient of thermal expansion of a material that makes up said IC chip.

\* \* \* \* \*